(12) United States Patent
Pingree et al.

(10) Patent No.: US 8,206,794 B2
(45) Date of Patent: Jun. 26, 2012

(54) SYSTEM AND METHOD FOR APPLYING ABRASION-RESISTANT COATINGS

(75) Inventors: Liam S. C. Pingree, Seattle, WA (US); Vasan S. Sundaram, Issaquah, WA (US); Michael R. Sirkis, Everett, WA (US); Shawn M. Pare, Woodinville, WA (US)

(73) Assignee: The Boeing Company, Chicago, IL (US)

( * ) Notice: Subject to any disclaimer, the term of this patent is extended or adjusted under 35 U.S.C. 154(b) by 458 days.

(21) Appl. No.: 12/435,110

(22) Filed: May 4, 2009

(65) Prior Publication Data

US 2010/0279027 A1 Nov. 4, 2010

(51) Int. Cl.
*B05D 3/04* (2006.01)
*B05D 1/00* (2006.01)
*H05H 1/24* (2006.01)

(52) U.S. Cl. .................... 427/569; 427/539; 427/579

(58) Field of Classification Search .......... 427/539, 427/569, 579
See application file for complete search history.

(56) References Cited

U.S. PATENT DOCUMENTS

| | | | | |
|---|---|---|---|---|
| 4,770,940 | A * | 9/1988 | Ovshinsky et al. | 428/408 |
| 4,927,704 | A * | 5/1990 | Reed et al. | 428/221 |
| 5,344,712 | A | 9/1994 | Basil et al. | |
| 5,494,712 | A * | 2/1996 | Hu et al. | 427/489 |
| 5,569,497 | A | 10/1996 | Verzaro et al. | |
| 6,010,967 | A * | 1/2000 | Donohoe et al. | 438/718 |
| RE37,294 | E | 7/2001 | Knapp et al. | |
| 6,495,208 | B1 * | 12/2002 | Desu et al. | 427/255.31 |
| 6,858,923 | B2 * | 2/2005 | Xia et al. | 257/678 |
| 2004/0180210 | A1 | 9/2004 | Vissing et al. | |
| 2005/0158480 | A1 * | 7/2005 | Goodwin et al. | 427/569 |
| 2006/0063015 | A1 * | 3/2006 | McCormick et al. | 428/457 |
| 2007/0122598 | A1 | 5/2007 | Coak et al. | |
| 2007/0196633 | A1 | 8/2007 | Coak et al. | |

FOREIGN PATENT DOCUMENTS

| | | |
|---|---|---|
| JP | 2006-175583 | 7/2006 |
| WO | 2006/049794 | 5/2006 |
| WO | 2008/137588 | 11/2008 |

OTHER PUBLICATIONS

R. Thyen et al., Plasma-enhanced chemical vapour deposition of thin films by corona discharge at atmospheric pressure. Surf. Coat. Technol, 97 (1997), p. 426-434.*
PCT, International Search Report and Written Opinion, International Application No. PCT/US2010/031095; 15 pages (Jul. 9, 2010).
"The Atomflo™ Plasma System," Product information from Surfx Technologies LLC, http://www.surfxtechnologies.com/producs.php, (2008).
Subramanian, C. et al., "Review of multicomponent and multilayer coatings for tribiological applications," *Wear,* 165, pp. 85-95 (1993).
Philipp, G. et al., "New Materials for Contact Lenses Prepared From Si- and Ti-Alkoxides by the So-Gel Process," *Journal of Non-Crystalline Solids,* 63, pp. 283-292 (1984).
U.S. Appl. No. 11/680,512, filed Feb. 28, 2007, Larson et al.
U.S. Appl. No. 12/137,390, filed Jun. 11, 2008 Larson et al.
U.S. Appl. No. 12/409,369, filed Mar. 23, 2009, Larson et al.

* cited by examiner

*Primary Examiner* — Jessee R. Roe
(74) *Attorney, Agent, or Firm* — Kathryn A. Soucy

(57) ABSTRACT

A method for applying an abrasion-resistant coating to a substrate including the steps of generating an atmospheric plasma, introducing a precursor to the atmospheric plasma, the precursor being selected to form the abrasion-resistant coating, and positioning the substrate relative to the atmospheric plasma such that the atmospheric plasma deposits the abrasion-resistant coating onto the substrate.

15 Claims, 3 Drawing Sheets

SYSTEM AND METHOD FOR APPLYING ABRASION-RESISTANT COATINGS

FIELD

The present patent application relates to the application of abrasion-resistant coatings to various substrates and, more particularly, to atmospheric plasma deposition of abrasion-resistant coatings onto transparent polymeric substrates and, even more particularly, to atmospheric plasma deposition of abrasion-resistant and chemical-resistant coatings onto transparent polymeric substrates.

BACKGROUND

Aircraft windows typically are made from stretched acrylic due to its light weight, flexibility and formability. However, stretched acrylic, like other transparent polymeric substrates, is readily susceptible to wear resulting from contact with various airborne particles (e.g., sand) and liquids (e.g., water), as well as regular contact with atmospheric contaminants and a variety of chemical agents, such as detergents, deicing fluids, and other chemicals used in aircraft maintenance.

Thus, in an effort to increase useful life, aircraft windows typically are treated with abrasion-resistant coatings.

Abrasion-resistant coatings for transparent polymeric substrates have traditionally been polysiloxane-based, polyurethane-based or hybrid sol-gel coatings. These sol-gel coatings are homogeneous mixtures of a solvent, an organosilane, an alkoxide and a catalyst that are processed to form a suitable coating. The sol-gel coatings provide high transmittance and limited durability against wear and ultraviolet induced degradation. The term sol-gel or solution-gelation refers to materials undergoing a series of reactions like hydrolization and condensation. Typically, a metal alkoxide or metal salt hydrolyzes to form a metal hydroxide. The metal hydroxides then condense in solution to form a hybrid organic/inorganic polymer. The ratio of organic to inorganic in the polymer matrix is controlled to maximize the performance for a given application. For example, increasing the organic groups would improve flexibility but may compromise wear durability. The sol-gel coating may include materials such as cerium or titanium to improve abrasion resistance and ultraviolet induced degradation of the coatings.

Such coatings are typically applied using flow-coating techniques, which require significant cure time, limit substrate geometry, and are often susceptible to particulate/dust damage during the curing process. Therefore, flow-coating techniques generally are not amenable to in-service or in-field repair.

Accordingly, those skilled in the art continue to seek new systems and methods for applying abrasion-resistant coatings to transparent polymeric substrates.

SUMMARY

In one aspect, the disclosed method for applying an abrasion-resistant coating to a substrate may include the steps of generating an atmospheric plasma, introducing a precursor to the atmospheric plasma, the precursor being selected to form the abrasion-resistant coating, and positioning the substrate relative to the atmospheric plasma such that the atmospheric plasma deposits the abrasion-resistant coating onto the substrate.

In another aspect, the disclosed method for applying an abrasion-resistant coating to a substrate may include the steps of introducing a shielding gas and a plasma-source gas to a chamber consisting of two electrodes to generate a plasma at the outlet head, introducing a cyclic organosilane precursor to the atmospheric plasma, the cyclic siloxane precursor being carried by a carrier gas, and while the cyclic siloxane precursor is being introduced to the atmospheric plasma, positioning the substrate relative to the atmospheric plasma device such that the atmospheric plasma deposits the silicon oxy-carbide coating onto the substrate.

Other aspects of the disclosed system and method for applying abrasion-resistant coatings will become apparent from the following description, the accompanying drawings and the appended claims.

DETAILED DESCRIPTION

Figure 1:
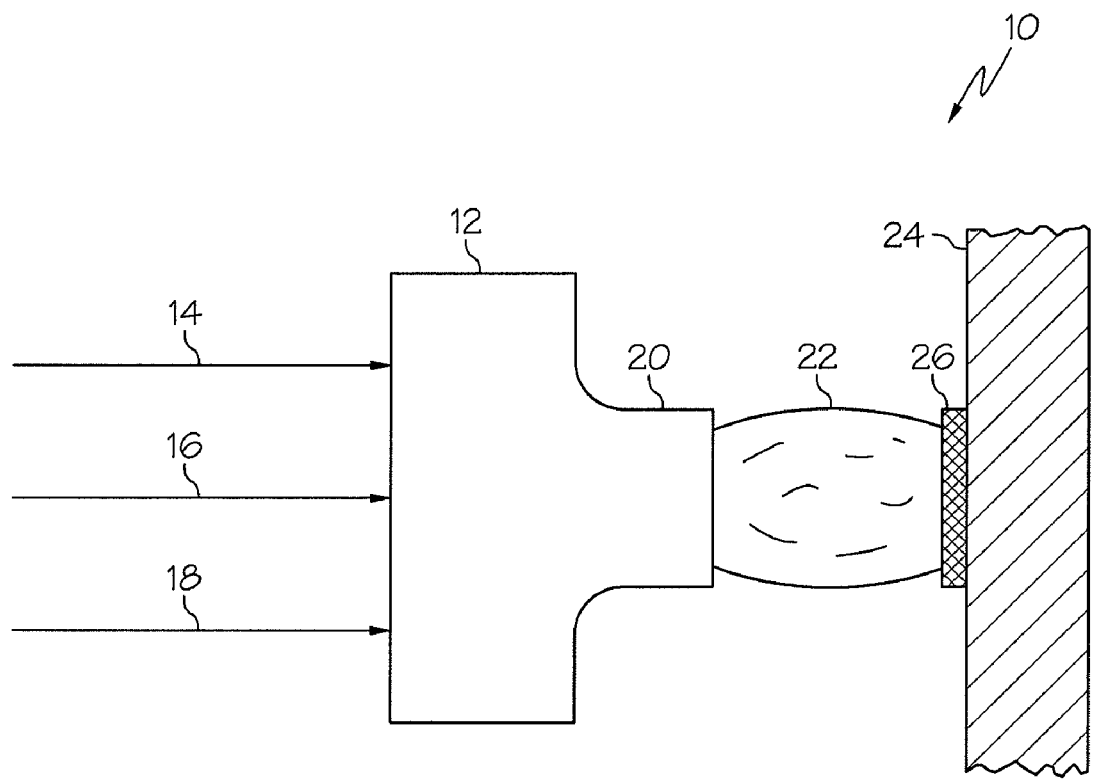
FIG. 1 is a schematic illustration of one aspect of the disclosed system for applying abrasion-resistant coatings.

As shown in FIG. 1, one aspect of the disclosed system for applying abrasion-resistant coatings, generally designated 10, may include an atmospheric plasma device 12, a plasma-source gas stream 14, a precursor stream 16 and, optionally, a shielding gas stream 18. The output 20 of the atmospheric plasma device 12 may be a plasma 22, which may be positioned relative to a substrate 24 to apply a coating 26 onto the substrate 24.

The substrate 24 may be any substrate capable of receiving an abrasion-resistant coating by way of a plasma 22. In one particular aspect, the substrate 24 may be a transparent polymeric substrate, such as stretched acrylic. Furthermore, while FIG. 1 shows a substrate 24 having a substantially flat configuration, those skilled in the art will appreciate that substrates 24 having various shapes, sizes and configurations may be used without departing from the scope of the present disclosure.

The atmospheric plasma device 12 may be any apparatus or system capable of exciting matter to form a plasma 22 under atmospheric conditions. The atmospheric plasma device 12 may be configured to generate the plasma 22 using direct current energy, radio frequency energy or the like, as is known in the art. In one aspect, the atmospheric plasma device 12 may be an atmospheric plasma spray gun. One example of an atmospheric plasma device 12 useful in accordance with the present disclosure is the ATOMFLO™ plasma system available from Surfx Technologies, LLC of Culver City, Calif.

The plasma-source gas stream 14 may be a stream of gas capable of forming atmospheric plasma upon activation by the atmospheric plasma device 12. Examples of appropriate plasma-forming gases include molecular gases, such as oxygen gas ($O_2$), nitrogen gas ($N_2$), hydrogen gas ($H_2$) and fluorine gas ($F_2$), as well as other gases. The plasma-source gas stream 14 may include combinations of gases without departing from the scope of the present disclosure. For example, the plasma-source gas stream 14 may be a stream of substantially pure oxygen gas.

In one aspect, the plasma-source gas stream 14 may be supplied to the atmospheric plasma device 12 at ideal gas conditions. In another aspect, the plasma-source gas stream 14 may be supplied to the atmospheric plasma device 12 at ambient conditions. For example, the plasma-source gas stream 14 may be at a pressure of about 1 atm and a temperature of about 25° C. Those skilled in the art will appreciate that physical conditions of the plasma-source gas stream 14 may vary depend upon the specific application and may be adjusted to optimize the performance of the atmospheric plasma device 12.

The precursor stream 16 may be a stream of precursor and, optionally, a carrier gas for carrying the precursor to the atmospheric plasma device 12. The carrier gas may be selected as a gas or combination of gases that does not undergo substantial plasma formation in the atmospheric plasma device 12. Examples of useful carrier gases include helium gas (He) and argon gas (Ar).

The precursor may be any material capable of forming an abrasion-resistant coating 26 when deposited onto a substrate 24 by way of the atmospheric plasma 22. In one aspect, the precursor may be any material capable of forming a silicon oxy-carbide ($SiO_xC_y$) coating when deposited onto a substrate 24 by way of the atmospheric plasma 22. In another aspect, the precursor may be (or may include) a cyclic siloxane. One example of an appropriate precursor is tetramethylcyclocyclotetrasiloxane ("TMCTS"). Another example of an appropriate precursor is octamethylcyclocyclotetrasiloxane ("OMCTS").

In one aspect, the precursor may be a relatively high vapor pressure liquid at standard temperature and pressure, and the carrier gas may be bubbled through the precursor to form the precursor stream 16. However, those skilled in the art will appreciate that various alternative techniques, such as vaporization, may be used to introduce the precursor to the precursor stream 16. In one specific aspect, the precursor stream 16 may be formed by bubbling helium gas through TMCTS liquid at ambient conditions.

The shielding gas stream 18 may be a stream of shielding gas that does not undergo substantial plasma formation in the atmospheric plasma device 12. The shielding gas may be present in the plasma 22, but, without being limited to any particular theory, may minimize the effects of atmospheric water, oxygen and other contaminants on the plasma 22. Examples of appropriate shielding gases include helium gas (He) and argon gas (Ar). The shielding gas stream 18 may include combinations of shielding gases without departing from the scope of the present disclosure. In one particular aspect, the shielding gas stream 18 may be a stream of substantially pure helium gas.

In one aspect, the shielding gas stream 18 may be supplied to the atmospheric plasma device 12 at ideal gas conditions. In another aspect, the shielding gas stream 14 may be supplied to the atmospheric plasma device 12 at ambient conditions. For example, the shielding gas stream 14 may be at a pressure of about 1 atm and a temperature of about 25° C. Those skilled in the art will appreciate that physical conditions of the shielding gas stream 14 may vary depend upon the specific application and may be adjusted to optimize the performance of the atmospheric plasma device 12.

At this point, those skilled in the art will appreciate that the plasma-source gas stream 14, the precursor stream 16 and the shielding gas stream 18 may be combined at the atmospheric plasma device 12 to form the plasma 22. However, those skilled in the art will also appreciate that two or more of the plasma-source gas, precursor and shielding gas streams 14, 16, 18 may be combined prior to reaching the atmospheric plasma device 12. For example, the plasma-source gas, precursor and shielding gas streams 14, 16, 18 may be supplied to the atmospheric plasma device 12 as a single stream.

The flow rates of the plasma-source gas, precursor and shielding gas streams 14, 16, 18 may be controlled to obtain desired concentrations of the plasma-source gas, precursor and shielding gas in the plasma 22. While not shown in FIG. 1, control values may be provided on the plasma-source gas, precursor and shielding gas streams 14, 16, 18 to control the associated flow rates. Those skilled in the art will appreciate that the relative concentrations of the plasma-source gas, precursor and shielding gas in the plasma 22 may be manipulated to optimize performance of the atmospheric plasma device 12 and to impart the resulting coating 26 with desired properties. For example, the concentration of oxygen in the plasma 22 may be decreased to increase the polymeric quality of the coating 26, thereby yielding a more flexible coating 26. Alternatively, the concentration of oxygen in the plasma 22 may be increased to render the coating 26 more inorganic, thereby yielding a harder coating 26.

In one aspect, the plasma-source gas stream 14 may comprise at most about 5 percent by volume of the input to the atmospheric plasma device 12 and the precursor stream 16 may comprise at most about 10 percent by volume of the input to the atmospheric plasma device 12, with the shielding gas stream 18 comprising the balance. In another aspect, the plasma-source gas stream 14 may comprise at most about 2 percent by volume of the input to the atmospheric plasma device 12 and the precursor stream 16 may comprise at most about 5 percent by volume of the input to the atmospheric plasma device 12, with the shielding gas stream 18 comprising the balance. In yet another aspect, the plasma-source gas stream 14 may comprise about 1 to 2 percent by volume of the input to the atmospheric plasma device 12 and the precursor stream 16 may comprise about 2 to 4 percent by volume of the input to the atmospheric plasma device 12, with the shielding gas stream 18 comprising the balance.

Figure 2:
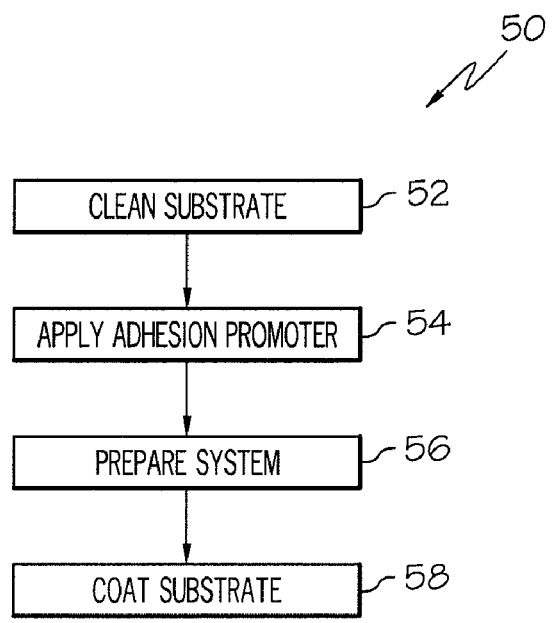
FIG. 2 is a flow chart illustrating one aspect of the disclosed method for applying abrasion-resistant coatings.

Referring to FIGS. 1 and 2, a method for applying an abrasion-resistant coating 26 to a substrate 24, generally designated 50, may begin with the step of cleaning the substrate, as shown at block 52. The substrate 24 may be cleaned using various solvents, such as ketones or light alcohols (e.g., methanol or isopropyl alcohol). Oxygen plasma may also be used to clean the substrate 24, which may also activate the surface receiving the coating 26. As shown at block 54, the clean substrate may optionally be treated with an adhesion promoter, such as an aluminum-based sol-gel adhesion promoter, as is known in the art.

As shown at block 56, the system 10 may be assembled by supplying the atmospheric plasma device 12 with the plasma-source gas, precursor and shielding gas streams 14, 16, 18 to form the plasma 22. The size of the plasma 22 may depend on various factors, including the size of the atmospheric plasma device 12 and the flow rates of the plasma-source gas, precursor and shielding gas streams 14, 16, 18. For example, the plasma 22 may be about 2 inches wide.

As shown at block 58, the substrate 24 may be coated by positioning the substrate 24 relative to the atmospheric plasma device 12 such that the plasma 22 deposits the coating 26 onto the substrate. The plasma 22 may be raster scanned across the substrate 24 to evenly coat the surface of the substrate 24. While a hand-held device may be used, those skilled in the art will appreciate that appropriate robotics may be employed such that a constant spacing is maintained between the substrate 24 and the atmospheric plasma device 12.

At this point, those skilled in the art will appreciate that additional coatings may be layered over the coating 26 without departing from the scope of the present disclosure. For example, a top coat may be applied using the disclosed method 50 or any other appropriate coating method (e.g., sol-gel).

EXAMPLE

An atmospheric plasma device obtained from Surfx Technologies LLC was used to deposit a silicon oxy-carbide ($SiO_xC_y$) coating onto a stretched acrylic substrate. The device was supplied with approximately 0.5 L/min oxygen gas, 1.0 L/min of TMCTS carried by helium gas, and 30 L/min helium gas (shielding gas). The TMCTS/helium stream was obtained by bubbling the helium gas carrier through a container of TMCTS liquid at ambient conditions.

Figure 3:
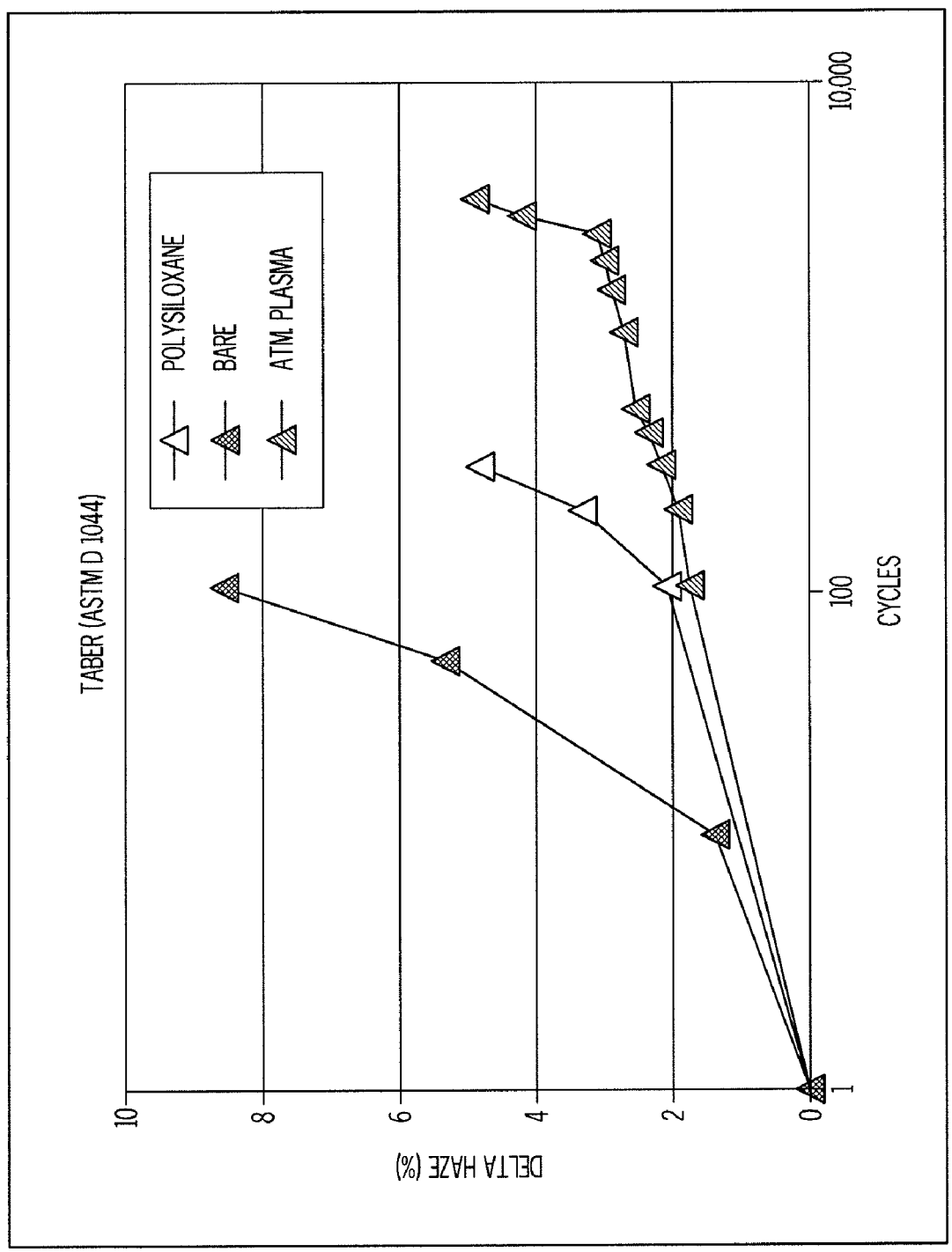
FIG. 3 is a graphical illustration of the Taber wear resistance data obtained for an exemplary coating applied in accordance with the present disclosure.
Figure 4:
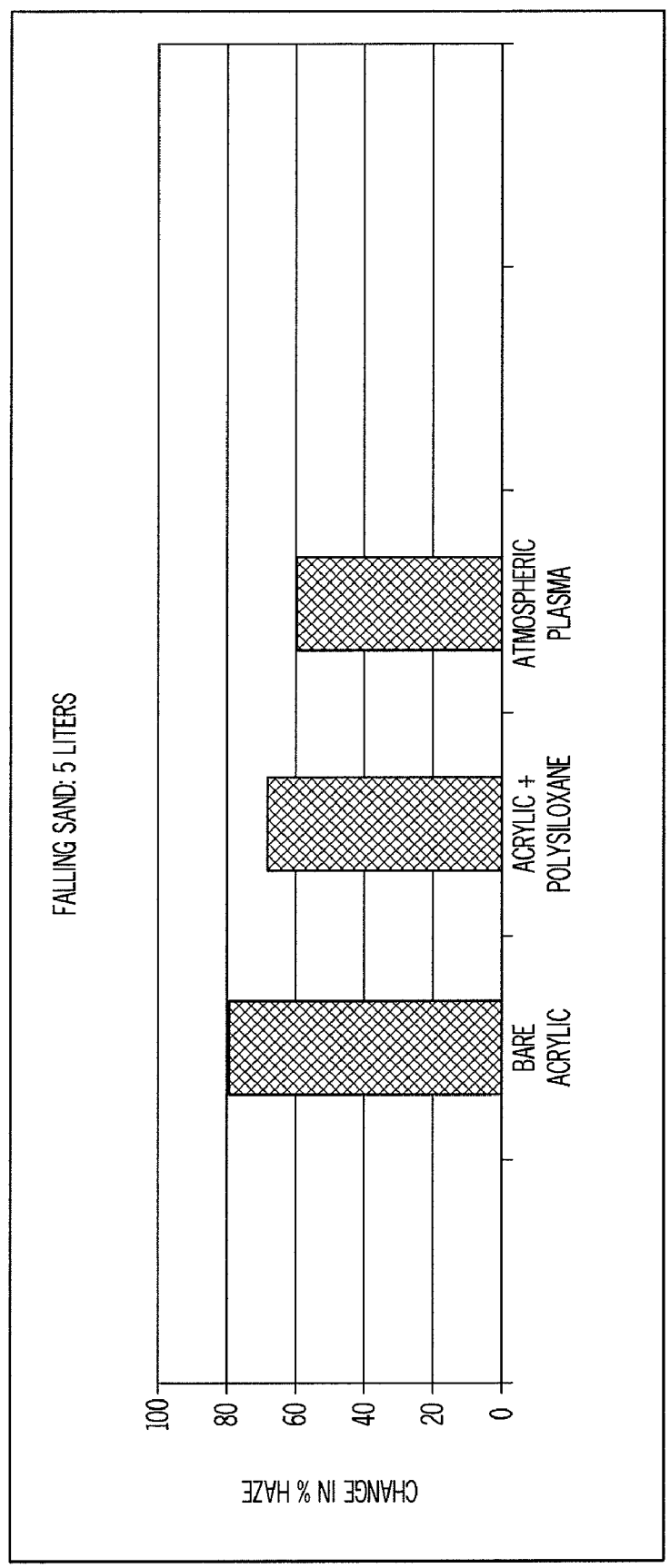
FIG. 4 is a graphical illustration of falling sand test wear resistance data obtained for an exemplary coating applied in accordance with the present disclosure.

The resulting atmospheric plasma-coated acrylic substrate was tested for abrasion resistance using the Taber abrasion test (ASTM D 1044-08) and the Falling Sand test (ASTM D968). The results are shown in FIGS. 3 and 4. For comparison, the same tests were performed on bare stretched acrylic and stretched acrylic coated with a polysiloxane sol-gel coating. The comparison data is also shown in FIGS. 3 and 4.

Accordingly, abrasion-resistant coatings applied with the disclosed system and method may be glass-like films having desired mechanical properties, including improved hardness and sufficient ductility to withstand flex in the substrate 24, such as the flex that an aircraft window undergoes during flight. Specifically, it is believed that a hardness of about 300 MPa to about 2.1 GPa may be achieved on silicon substrates and a hardness of about 500 to about 1.5 GPa may be achieved on stretched acrylic substrates.

Furthermore, the disclosed system and method may decrease the time to coat parts, decrease the footprint required for coatings application at the manufacturing level, eliminate the requirement for flow coating equipment and curing ovens, eliminate the need for complex and expensive vacuum deposition systems, eliminate the need for masking of the non-target surfaces due to the application method, and may allow for assemblies with non-vacuum compatible components (e.g., rubber and gel-like seals) to be processed without costly disassembly.

Still furthermore, the disclosed system and method for applying abrasion-resistant coatings may be compatible with repair processes and may be practiced in the field.

Although various aspects of the disclosed system and method for applying abrasion-resistant coatings have been shown and described, modifications may occur to those skilled in the art upon reading the specification. The present application includes such modifications and is limited only by the scope of the claims.

What is claimed is:

1. A method for applying a silicon oxy-carbide coating onto a substrate comprising the steps of:
   introducing a shielding gas and a plasma-source gas to an atmospheric plasma device to generate an atmospheric plasma;
   introducing a cyclic organosiloxane precursor to said atmospheric plasma, said cyclic organosiloxane precursor being carried by a carrier gas; and
   while said cyclic organosiloxane precursor is being introduced to said atmospheric plasma, positioning said substrate relative to said atmospheric plasma device such that said atmospheric plasma deposits said silicon oxy-carbide coating onto said substrate.

2. The method of claim 1 wherein said substrate is a transparent polymeric substrate.

3. The method of claim 1 wherein said substrate is stretched acrylic.

4. The method of claim 1 wherein said atmospheric plasma is an atmospheric oxygen plasma.

5. The method of claim 1 further comprising the step of varying a volumetric ratio of said plasma-source gas stream to said precursor to manipulate the physical properties of said abrasion-resistant coating.

6. The method of claim 1 wherein said shielding gas stream includes at least one of helium gas and argon gas and said plasma-source gas stream includes a molecular gas.

7. The method of claim 1 wherein said shielding gas stream includes helium gas and said plasma-source gas stream includes oxygen gas.

8. The method of claim 1 wherein said carrier gas includes at least one of helium gas and argon gas.

9. The method of claim 1 wherein said precursor includes tetramethylcyclocyclotetrasiloxane.

10. The method of claim 1 wherein said precursor includes octamethylcyclocyclotetrasiloxane.

11. The method of claim 1 wherein said positioning step includes maintaining a constant spacing between said substrate and said atmospheric plasma device.

12. The method of claim 11 wherein said atmospheric plasma device is mounted on a robotic device, and wherein said constant spacing is maintained by said robotic device.

13. The method of claim 1 further comprising the step of cleaning said substrate prior to said positioning step.

14. The method of claim 1 further comprising the step of treating said substrate with oxygen plasma that is substantially free of said precursor prior to said positioning step.

15. The method of claim 1 further comprising the step of rastering said atmospheric plasma relative to said substrate.

* * * * *